United States Patent [19]

DiStefano

[11] Patent Number: 4,835,008

[45] Date of Patent: May 30, 1989

[54] PROCESS OF FORMING BREADBOARD INTERCONNECT STRUCTURE HAVING PLATED THROUGH-HOLES

[75] Inventor: Ralph D. DiStefano, Palm Bay, Fla.

[73] Assignee: Harris Corp., Melbourne, Fla.

[21] Appl. No.: 104,375

[22] Filed: Oct. 5, 1987

[51] Int. Cl.[4] .............................................. B05D 5/12
[52] U.S. Cl. ...................................... 427/96; 427/98; 427/97
[58] Field of Search ............................. 427/98, 96, 97

[56] References Cited

U.S. PATENT DOCUMENTS

| | | | |
|---|---|---|---|
| 3,457,638 | 7/1969 | Johnson | 427/98 |
| 3,672,986 | 6/1972 | Schneble | 427/98 |
| 4,206,254 | 6/1980 | Schmeckenbecher | 427/98 |
| 4,224,361 | 9/1980 | Romankiw | 427/98 |
| 4,377,316 | 3/1983 | Ecker | 439/71 |
| 4,388,351 | 6/1983 | Sawyer | 427/98 |
| 4,526,810 | 7/1985 | Nesbitt | 427/98 |
| 4,606,787 | 8/1986 | Pelligrino | 430/315 |

Primary Examiner—Shrive Beck
Assistant Examiner—Vi Duong Dang
Attorney, Agent, or Firm—Antonelli, Terry & Wands

[57] ABSTRACT

A process for forming an interconnect structure atop an insulated circuit board comprises selectively forming a first metallic (copper) layer on a first surface of an insulator (Teflon) board, so as to define the intended geometry of a pattern of interconnect metal. Atop this structure a buffer layer of photoresist is non-selectively formed and then apertures are drilled through selected locations in the buffer layer and underlying metallic layer and insulator board. Next, the resulting structure is plated with a second metallic layer, so as to coat the buffer layer and sidewalls of the apertures with a metallic plating. Finally, a photoresist wash is applied to cause the buffer layer to be dissolved and its coating of metallic plating to be lifted off the insulator board and the first metallic layer. Since the original geometry of the interconnect line pattern has been protected during through-hole formation and electroplating its electrical characteristics remain unaltered. When the buffer layer of protective photoresist is dissolved the electroplate simply lifts off the board away from the plated through-holes and built-up interconnect, thereby leaving the pattern of interconnect metal and the coating of metallic plating in the apertures intact.

11 Claims, 2 Drawing Sheets

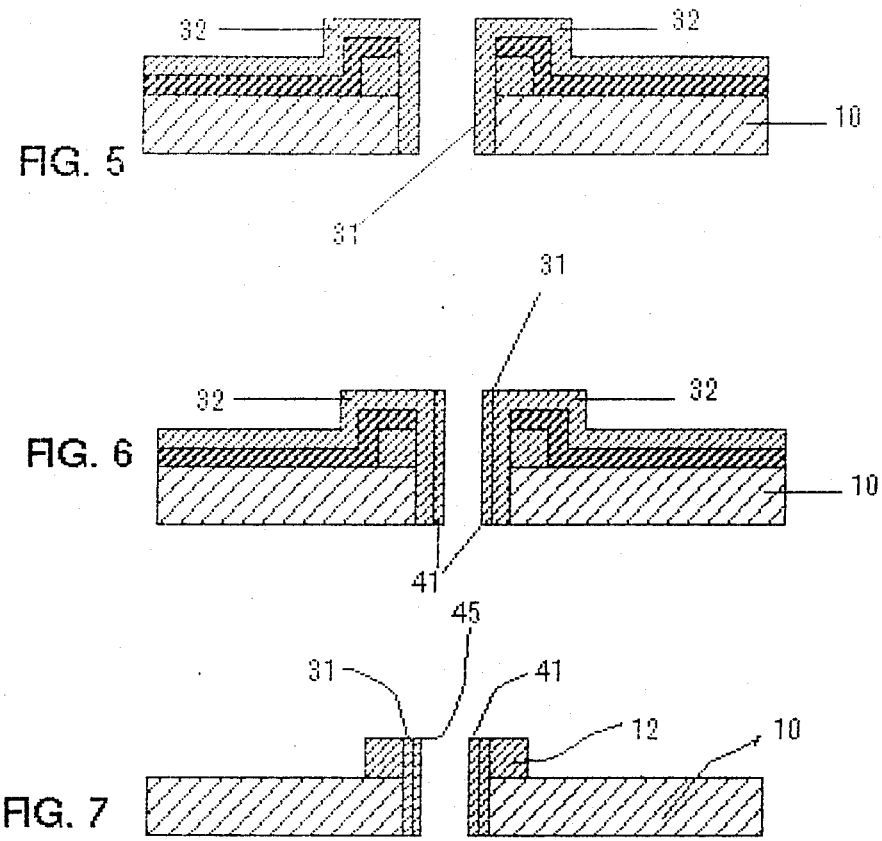
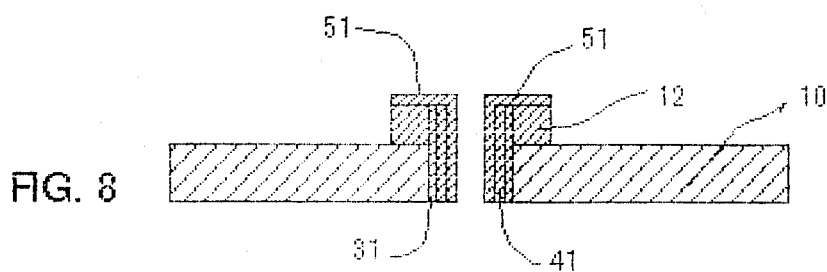

PROCESS OF FORMING BREADBOARD INTERCONNECT STRUCTURE HAVING PLATED THROUGH-HOLES

FIELD OF THE INVENTION

The present invention relates in general to microminiaturized circuit interconnect structures and is particularly directed to a process for forming a breadboard interconnect structure having plated through-holes.

BACKGROUND OF THE INVENTION

During initial stages of circuit design, interconnect structures or breadboards are used for circuit layout and performance testing and evaluation. Like their integrated circuit counterparts, breadboard interconnect characteristics must faithfully replicate intended electrical parameters in order to accurately test the functionality of a given circuit configuration. For this purpose a typical breadboard circuit layout may contain one or more layers of interconnect metal plated on one or both sides of an insulator board, with plated through-holes passing through the board to electrically join selected locations of an interconnect pattern to the opposite side of the board where additional pattern or ground plane conductive layers ar disposed. The patterning of the metallized conductor (usually copper) itself is originally precisely defined in accordance with preselected electrical circuit impedance parameters (in terms of line width and thickness) and is expected to be produced as such in an actual breadboard implementation. Unfortunately, however, because of the manner in which the metal is patterned and the through-holes plated to obtain a prescribed interconnect layout, the actual shapes of the interconnect lines may depart from their intended geometries and, consequently, alter the impedance parameters of the interconnect structure, such that accurate testing of the circuit design cannot be accomplished.

More particularly, conventional formation of a breadboard interconnect structure typically involves the selective masking of a layer of metal that has been formed over the entire surface of an insulator (e.g. Teflon) board to expose those areas whereat the interconnect metal pattern including plated through-holes is to be provided. After through-holes have been drilled in the exposed areas of the original metal, subsequent layers of interconnect metal and older lay-up are electrodeposited on the unmasked metal and in the through-holes, so as to define the composition of the interconnect structure. Then, the original mask is removed to expose the metal layer adjacent to the electrodeposited plate/solder layer overlying the originally unmasked metal. The now exposed metal of the original plated layer is removed by using the built-up layer as a mask, so that what is left is an interconnect pattern with plated through-holes. The problem with this technique of forming the plated through-holes prior to defining the interconnect pattern is the nonuniformity of the electrical characteristics in the interconnect pattern that have been created by variations in electroplating current density, so that the actual shape of the original metal layer underlying the electrodeposited build-up is altered (due to etch undercut), thereby modifying the impedance characteristics of the line pattern.

SUMMARY OF THE INVENTION

In accordance with the present invention, nonuniformity in the electrical parameters in the interconnect pattern of a circuit breadboard resulting from the use of electrodeposited metal as a mask for defining the line pattern configuration is avoided by a methodology which initially patterns the base metal to its intended shape and then protects that shape during subsequent through-hole formation and plating. Since the geometry of the original line pattern is not altered (undercut during subsequent etching), electrical design parameters of the interconnect are retrained, so that the functionality of the overall circuit can be accurately tested and evaluated.

Rather than initally electrodeposit an interconnect overly structure and then use the imprecisely defined electrodeposited overlay structure as a mask to etch unwanted metal, as described above, the process according to the present invention forms the interconnect pattern first and then carries out the electroplating of the through-holes. In particular, the process according to the present invention comprise the steps of selectively forming a first metallic layer on a first surface of an insulator board, so as to define a pattern of interconnect metal. Atop this structure a buffer layer of photoresist is non-selectively formed and then apertures are drilled through selected locations in the buffer layer and underlying metallic layer and insulator board. Next, the resulting structure is plated with a second metallic layer, so as to coat the buffer layer and sidewalls of the apertures with a metallic plating. Finally, a photoresist wash is applied to cause the buffer layer to be dissolved and its coating of metallic plating to be "lifted off" the insulator board and the first metallic layer. Since the original geometry of the interconnect line pattern has been protected during through-hole formation and electroplating, its electrical characteristics remain unaltered. Moreover, when the buffer layer of protective photoresist is dissolved the electroplate simply lifts off the board away from the plated through-holes and built-up interconnect, thereby leaving the pattern of interconnect metal an the coating of metallic plating in the aperture intact.

BRIEF DESCRIPTION OF THE DRAWINGS

FIGS. 1–8 diagrammatically illustrate a breadboard interconnect structure during successive steps of its manufacture in accordance with the methodology of the present invention.

DETAILED DESCRIPTION

Referring now to FIGS. 1–8 the process of manufacture of the printed circuit board interconnect structure according to the present invention will be described.

Figure 1:
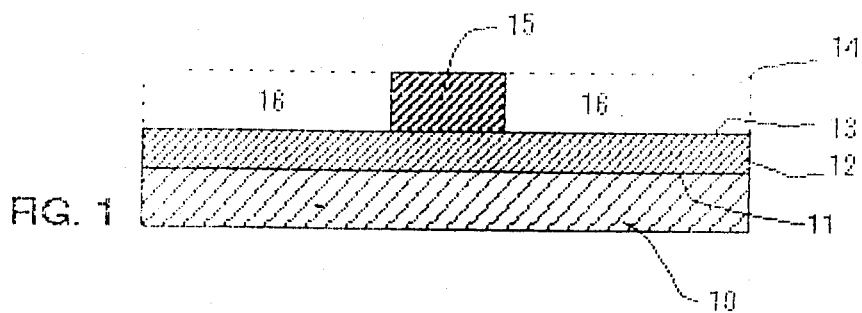

Initially, as shown in FIG. 1, a printed circuit board 10 comprised of a suitable insulative material, such as Teflon, having a thickness on the order of 0.010–0.20 mils and having a copper cladding layer 12 on a top surface 11 is provided. The thickness of copper layer 12 may be on the order of 0.0014 mil. Over the top surface 13 of the copper cladding (buffer) layer 12 a layer of photoresist (removable insulator material) 14, such as Shipley 111S, is formed and exposed to an interconnect mask pattern. The layer of photoresist 14 is then developed to leave a protective photoresist region 15 overlying that portion of the copper layer 12 which will form a conductive line of the resulting interconnect pattern.

Those portions of the photoresist layer 14 which have been developed and removed are shown at 16.

Figure 2:
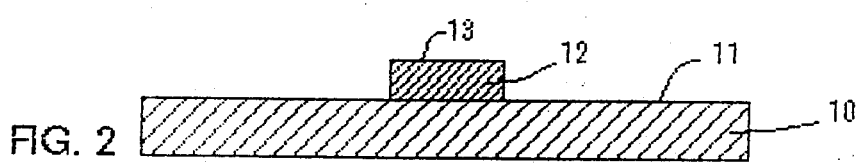

Next, as shown in FIG. 2, a suitable etchant, such as sodium persulfate, is applied to the exposed copper cladding layer 12, so as to etch away the exposed copper and leave only a line portion 12 thereof beneath the protective photoresist layer 15. Photoresist region 15 is then removed using a suitable wash, such as acetone, and a cleansing solution of Allied-Kelite ISU-PREP 58 is applied to the entire surface shown in FIG. 2. This treating process involves vapor blasting the copper line 12 and Teflon surface and applying a Teflon tetra etch, such as poly etch, to the exposed surface 11 of the insulator board 10. A cleansing solution of ISO-PREP 58 is then applied to the copper interconnect line pattern 12, followed by the application of a black oxide film Enthone's Ebonal-C for copper to copper bond to ensure strong bonding during the lamination process to be described below. The entire structure is then wiped with alcohol to clean any residue from the exposed surface of the Teflon board 10 and the copper interconnect line 12 thereon.

Figure 3:
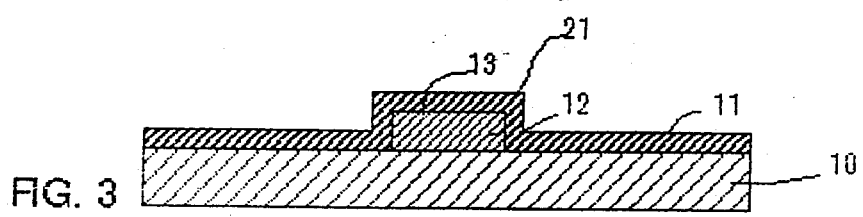

Next, as shown in FIG. 3, a layer of negative photoresist material 21, such as Kodak Photo-Resist 752, is nonselectively applied over the entirety of the structure shown in FIG. 3 to a thickness on the order 0.001–0.003 mils. The resulting structure is cured for approximately 60 minutes in a temperature range of 100°–110° C., to toughen up the photoresist layer 21.

Figure 4:
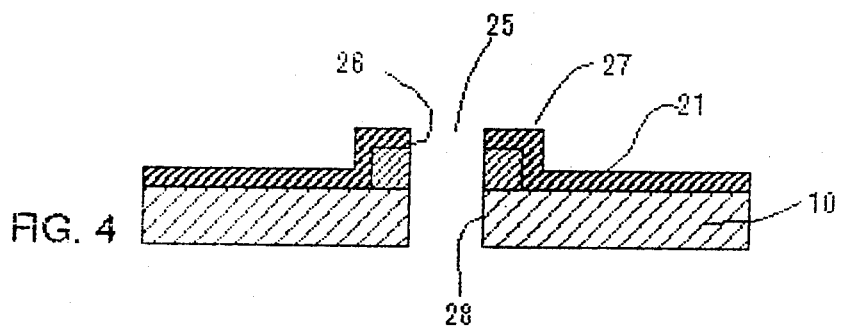

Then as shown in FIG. 4, through-holes 25 corresponding to aperture interconnect points of the intended circuit design are drilled through the entirety of the structure, including the toughened photoresist layer 21, copper interconnect line 12 and Teflon insulator board 10. Next, a Teflon tetra etch solution of poly etch, is applied to the drilled holes for a period of time on the order of 15–20 seconds, so as to roughen up their interior side walls 28 through the board 10 and thereby enhance the adhesion of a subsequently applied metallic layer to sidewalls 28. During this treatment, the negative photoresist layer 21 protects the copper layer 12 therebeneath. The entire structure is then rinsed in alcohol and 10% hydrochloric acid to effectively scour its surface, and thereafter rinsed in DI water and emersed in a light cleaner and again rinsed with the DI water to remove residue from drilled holes.

Next, the structure is rinsed in a conditioner solution of Shipley 1160 for a period of approximately 5 minutes and then again rinsed in DI water. Teflon board 10 is then sensitized and activated by immersing in Shipley 9F solution and rinsed again in DI water. The structure is now ready for the application of electroplate in the through-holes 25.

For this purpose, as shown in FIG. 5, copper plating is built up in the through-holes 25 and on the top surface of photoresist layer 21 through an electroless plating process to initiate a thin layer in the drilled holes and also on the negative resist for electrical connection for a period of 3045 minutes. During this process, a copper electroless-plated layer 31 having thickness on the order of 50–100 of an inch is built up on the entire side walls 26 of the through-holes 25, including treated portion 28, and the top surface 27 of photoresist layer 21.

Following the electroless plating of layer 31, a subsequent layer 41 of copper electroplate, as shown in FIG. 6, is built up on the side walls electroplate layer 26 in the throughholes 25 for a dense deposit for solder connection. During this electroplating operation, there is no further build up of the copper layer 31 on the top surface 27 of the photoresist layer 21. The thickness of the copper plate within the apertures is preferably on the order of 0.5–1.0 mil.

Following the electroplate build up of the copper within apertures 25, the entire structure is rinsed in DI water and then a photoresist solvent, such as xylene, is applied to dissolve the photoresist layer 21 beneath the electroless copper plate 31 formed thereon, as shown in FIG. 7. The dissolving of the photoresist layer 21 causes the overlying electroless plate layer 31 to effectively crumble in the region of the lip 45 of the aperture 25, so that the overlying copper layer 31 effectively "lifts off" the structure leaving only the Teflon board 10, the copper interconnect lines 12 and the plated apertures 25. It is to be noted that the geometry of the copper lines 12, having been protected by the photoresist layer 21 during the aperture formation and the electroplating of the apertures, has not changed. consequently, intended electrical characteristics of the circuit design are maintained, so that subsequent circuit performance testing can be accurately carried out.

The structure shown in FIG. 7 is next cleaned and polished using copper cleaner-rinsed in D1 water and then an electroless plate layer 51, such as a tin plate, is applied on the top surface 13 of interconnect line 12 and in the plated through holes 25 as shown in FIG. 8.

As will be appreciated from the foregoing description, the problem of nonuniformity of the electrical characteristics in a breadboard interconnect pattern, that have been created by variations in electroplating current density, so that the actual shape of the original metal layer underlaying the electrodeposited build-up is altered (due to etch undercut), thereby modifying the impedance characteristics of the line pattern, are obviated in accordance with the methodolgy of the present invention by initially patterning the base metal to its intended shape and then protecting that shape during subsequent through-hole formation and plating. Since the geometry of the original line pattern is not altered (undercut during subsequent etching), electrical design parameters of the interconnect are retained, so that the functionality of the overall circuit can be accurately tested and evaluated.

While I have shown and described an embodiment in accordance with the present invention, it is to be understood that the same is not limited thereto but is susceptible to numerous changes and modifications as known to a person skilled in the art, and I therefor do not wish to be limited to the details shown and described herein but intend to cover all such changes and modifications as are obvious to one of ordinary skill in the art.

What is claimed is:

1. A method of forming an interconnect structure for a printed circuit board comprising the steps of:
   (a) selectively forming a first layer of conductive material on a first surface of an insulator board;
   (b) forming a second layer of removable protective material over the structure formed in step (a);
   (c) forming apertures through said first and second layers and through said insulator board therebeneath;
   (d) coating the structure formed by step (c) with conductive material, so as to conductively coat the walls of said apertures; and
   (e) removing said second layer of removable protective material formed in step (b), so as to remove conductive material coated thereon, while leaving said first layer of conductive material and the conductive coating on the walls of said apertures through said first layer and said insulator board intact.

2. A method according to claim 1, further comprising the step of:
   (f) forming a third layer of conductive material on said first layer and on the conductive coating formed in said apertures.

3. A method according to claim 1, wherein step (a) comprises the steps of:
   (a-1) non-selectively forming a first layer of conductive material on said first surface of said insulator board; and
   (a-2) selectively etching said first layer of conductive material to form a pattern of conductive interconnect lines on said first surface of said insulator board.

4. A method according to claim 3, wherein step (b) comprises non-selectively forming a second layer of photoresist material of the structure formed by step (a-2).

5. A method according to claim 4, wherein step (d) comprises electrolessly plating the structure formed by step (c) with a layer of conductive material so as to conductively coat said second layer of photoresist material and the walls of said apertures.

6. A method according to claim 5, wherein step (e) comprises applying a solvent to the structure formed by step (d), so as to effectively dissolve said photoresist layer and lift off the overlying layer of conductive material, while leaving the conductive coating of the walls of said apertures intact.

7. A method according to claim 6, further comprising the step of:
   (f) forming a third layer of conductive material on said first layer and on the conductive coating formed in said apertures.

8. A method according to claim 4, wherein step (b) comprises non-selectively forming a layer of negative photoresist material on the structure formed by step (a) and curing said layer of negative photoresist material.

9. A method of forming a metallic interconnect structure for a printed circuit board comprising the steps of:
   (a) selectively forming a first metallic layer on a first surface of an insulator board so as to define a pattern of interconnect metal on said first surface of said board;
   (b) non-selectively applying a buffer layer of removable insulator material over the structure formed by step (a);
   (c) forming apertures through the structure formed by step (b), so that said apertures extend through each of said buffer layer, said first layer and said insulator board;
   (d) plating the structure formed by step (c) with a second metallic layer, so as to coat said buffer layer and the sidewalls of said apertures with a metallic plating: and
   (e) applying a solvent to the structure formed by step (d), causing said buffer layer to be dissolved and its coating of metallic plating to be lifted off said insulator board and said first metallic layer, while leaving said pattern of interconnect metal and the coating of metallic plating in said apertures intact.

10. A method according to claim 9, wherein step (d) comprises
   (d-1) non-selectively electrolessly plating the structure formed by step (c) with a second metallic layer, so as to coat the sidewalls of said apertures and said buffer layer with metallic plating, and
   (d-2) electroplating a third metallic layer on the second metallic layer plating in said apertures.

11. A method according to claim 9, wherein step (d) comprises
   (d-1) treating the sidewalls of the apertures through said insulator board with a material that enhances the adhesion of a metallic layer to the sidewall of apertures through said insulator board;
   (d-2) non-selectively electrolessly plating the structure formed by steps (c) and (d-1) with a second metallic layer so as to coat said buffer layer and the sidewalls of said apertures with a metallic plating; and
   (d-3) electroplating a third metallic layer on the second metallic layer plated on the sidewalls of said apertures.

* * * * *